(12) United States Patent
Sun et al.

(10) Patent No.: US 10,693,101 B2
(45) Date of Patent: Jun. 23, 2020

(54) OLED PANEL HAVING AUXILIARY CATHODE

(71) Applicant: BOE TECHNOLOGY GROUP CO., LTD., Beijing (CN)

(72) Inventors: Zhongyuan Sun, Beijing (CN); Wei Huang, Beijing (CN); Zhiqiang Jiao, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 15/992,970

(22) Filed: May 30, 2018

(65) Prior Publication Data

US 2019/0097167 A1    Mar. 28, 2019

(30) Foreign Application Priority Data

Sep. 25, 2017   (CN) .......................... 2017 1 0880512

(51) Int. Cl.
  *H01L 51/00*    (2006.01)
  *H01L 51/52*    (2006.01)
  (Continued)

(52) U.S. Cl.
  CPC ...... *H01L 51/5228* (2013.01); *H01L 27/3258* (2013.01); *H01L 27/3279* (2013.01); *H01L 51/0022* (2013.01); *H01L 51/5234* (2013.01); *H01L 51/5246* (2013.01); *H01L 51/5253* (2013.01); *H01L 51/5256* (2013.01);
  (Continued)

(58) Field of Classification Search
  CPC . H01L 51/5228; H01L 51/56; H01L 51/5246; H01L 51/5253; H01L 27/3258; H01L 51/5234; H01L 51/0022; H01L 2251/308; H01L 2251/5315; H01L 27/3218; H01L 27/3216; H01L 2251/305;
  (Continued)

(56) References Cited

U.S. PATENT DOCUMENTS 7,619,359 B2 * 11/2009 Kim ........................ B82Y 20/00
                                                              313/504
7,621,793 B2 * 11/2009 Makiura ............. H01L 51/5088
                                                              313/504
(Continued)

FOREIGN PATENT DOCUMENTS

CN       101097944 A      1/2008
CN       104637956 A      5/2015
(Continued)

OTHER PUBLICATIONS

Chinese Office Action in Chinese Application No. 201710880512.5, dated Jul. 12, 2019 with English translation.

*Primary Examiner* — Shouxiang Hu
(74) *Attorney, Agent, or Firm* — Collard & Roe, P.C.

(57) ABSTRACT

An OLED panel and a manufacturing method thereof are provided. The panel includes a substrate, a plurality of OLED devices disposed on the substrate and an auxiliary cathode. The OLED devices include a cathode and have light emitting areas respectively. The auxiliary cathode is disposed on the cathode of the OLED devices in electrical contact with the cathode and the auxiliary cathode is at least partially located in the light emitting areas of the OLED devices. A material of the auxiliary cathode is a transparent conductive material.

15 Claims, 6 Drawing Sheets

(51) Int. Cl.
*H01L 27/32* (2006.01)
*H01L 51/56* (2006.01)

(52) U.S. Cl.
CPC .......... *H01L 51/5275* (2013.01); *H01L 51/56* (2013.01); *H01L 27/3216* (2013.01); *H01L 27/3218* (2013.01); *H01L 27/3246* (2013.01); *H01L 2251/305* (2013.01); *H01L 2251/308* (2013.01); *H01L 2251/5315* (2013.01)

(58) Field of Classification Search
CPC ............. H01L 27/3246; H01L 27/3279; H01L 51/5256; H01L 51/5212
See application file for complete search history.

(56) References Cited

U.S. PATENT DOCUMENTS

| | | | |
|---|---|---|---|
| 10,021,741 B2 * | 7/2018 | Lee | C23C 16/401 |
| 10,181,582 B2 * | 1/2019 | Matsusue | H01L 51/5092 |
| 10,193,100 B2 | 1/2019 | Qi et al. | |
| 2005/0248270 A1 * | 11/2005 | Ghosh | H01L 51/524 |
| | | | 313/512 |
| 2008/0001537 A1 | 1/2008 | Chen et al. | |

FOREIGN PATENT DOCUMENTS

| | | |
|---|---|---|
| CN | 105428548 A | 3/2016 |
| CN | 205092271 U | 3/2016 |

\* cited by examiner

OLED PANEL HAVING AUXILIARY CATHODE

CROSS-REFERENCE TO RELATED APPLICATIONS

The application claims priority to the Chinese patent application No. 201710880512.5, filed on Sep. 25, 2017, the entire disclosure of which is incorporated herein by reference as part of the present application.

TECHNICAL FIELD

Embodiments of the present disclosure relate to an organic light-emitting diode (OLED) panel and a manufacturing method thereof.

BACKGROUND

Organic light emitting diodes (OLEDs) relate to a phenomenon that organic semiconducting materials and luminescent materials are driven to emit light by applied electric fields through actions of carrier injection and recombination. Compared to liquid crystal display (LCD) panels, OLED display panels have advantages such as lower power consumption, faster response speed, wide viewing angle, high contrast ratio, and so on. Especially in the field of flexible display, OLED display panels still have a good display effect in a state of having a certain bending radius, and therefore have a remarkable broad prospect in the field of wearable products.

At present, OLED display panels are divided into two types of structure: top-emitting structure and bottom-emitting structure. Light emitted from a top-emitting type OLED display panel transmits from a side of a cathode, so the cathode of the top-emitting OLED panel needs to use a transparent conductive material such as thin Mg & Ag alloy, indium zinc oxide (IZO), or the like. The transparent conductive cathode may be manufactured through methods such as vacuum evaporation, magnetron sputtering, chemical vapor deposition, or the like.

SUMMARY

At least one embodiment of the present disclosure provides an OLED panel, comprising: a substrate; a plurality of OLED devices disposed on the substrate, wherein the OLED devices comprise a cathode and have light emitting areas respectively; and an auxiliary cathode, wherein the auxiliary cathode is disposed on the cathode of the OLED devices in electrical contact with the cathode and the auxiliary cathode is at least partially located in the light emitting areas of the OLED devices, and a material of the auxiliary cathode is a transparent conductive material.

In the OLED panel provided by at least one example, a light emergent surface of the auxiliary cathode protrudes outward along a light emergent direction of the OLED device.

In the OLED panel provided by at least one example, the transparent conductive material of the auxiliary cathode comprises a transparent conductive oxide.

In the OLED panel provided by at least one example, the transparent conductive oxide comprises one or more of indium zinc oxide, indium tin oxide, zinc oxide, and indium oxide.

In the OLED panel provided by at least one example, portions of the auxiliary cathode on two adjacent OLED devices are connected to each other.

In at least one example, the OLED panel further comprises: a pixel driving circuit disposed on the substrate and an insulating layer covering the pixel driving circuit, wherein the OLED devices are disposed on the insulating layer.

In at least one example, the OLED panel further comprises a thin film encapsulation structure, wherein the thin film encapsulation structure is disposed on the auxiliary cathode and covers the insulating layer.

In the OLED panel provided by at least one example, the thin film encapsulation structure comprises a first inorganic encapsulation layer, and the first inorganic encapsulation layer is disposed on the auxiliary cathode and covers the insulating layer.

In the OLED panel provided by at least one example, the thin film encapsulation structure comprises a first inorganic encapsulation layer, an organic encapsulation layer and a second inorganic encapsulation layer, the first inorganic encapsulation layer is disposed on the auxiliary cathode and covers the insulating layer, the organic encapsulation layer is disposed on the first inorganic encapsulation layer, and the second inorganic encapsulation layer is disposed on the organic encapsulation layer.

In the OLED panel provided by at least one example, a projection of the organic encapsulation layer on the substrate encloses a projection of the cathode of the OLED devices on the substrate, and the projection of the organic encapsulation layer on the substrate is located inside a projection of the first inorganic encapsulation layer on the substrate.

In the OLED panel provided by at least one example, a projection of the second inorganic encapsulation layer on the substrate encloses the projection of the organic encapsulation layer on the substrate.

In at least one example, the OLED panel further comprises an encapsulation substrate and a sealant, wherein the encapsulation substrate is disposed on the side of the OLED panel far away from the substrate, the sealant is disposed at periphery of the insulating layer, and the substrate is connected to the encapsulation substrate through the sealant.

At least one embodiment of the present disclosure also provides a manufacturing method of an OLED panel, comprising: forming a plurality of OLED devices on a substrate, wherein the OLED devices comprise a cathode and have light emitting areas respectively; and forming an auxiliary cathode on the cathode of the OLED devices, wherein the auxiliary cathode is at least partially located in the light emitting areas and is in electrical contact with the cathode, and a material of the auxiliary cathode is a transparent conductive material.

In the manufacturing method provided by at least one example, a light emergent surface of the auxiliary cathode protrudes outward along a light emergent direction of the OLED device.

In the manufacturing method provided by at least one example, forming the of auxiliary cathode on the cathode of the OLED devices comprises: preparing a solution containing the transparent conductive material; printing the solution on the cathode by using an ink jet printing method; and solidifying the printed solution to form the auxiliary cathode.

In the manufacturing method provided by at least one example, an aqueous oxygen content of the solution is about 0.8 ppm to 1.2 ppm.

BRIEF DESCRIPTION OF THE DRAWINGS

In order to clearly illustrate the technical solution of the embodiments of the disclosure, the drawings of the embodiments will be briefly described in the following. It is obvious that the described drawings are only related to some embodiments of the disclosure and thus are not limitative of the disclosure.

DETAILED DESCRIPTION

Figure 1A:
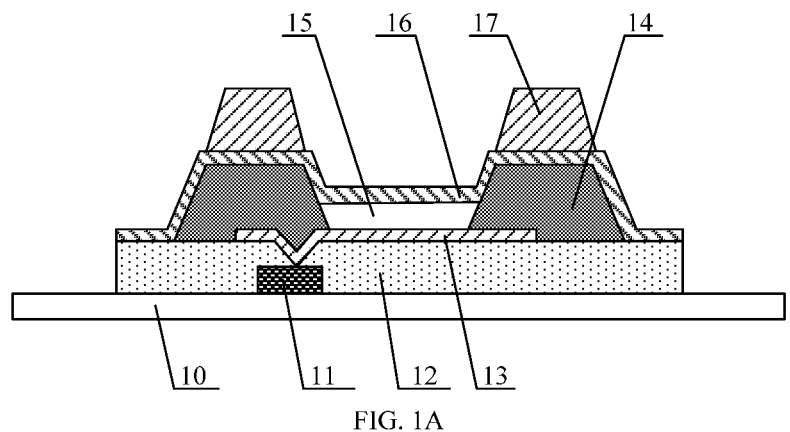
FIG. 1A is a structural schematic view of a top-emitting OLED panel.

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment(s), without any inventive work, which should be within the scope of the disclosure.

Unless otherwise defined, all the technical and scientific terms used herein have the same meanings as commonly understood by one of ordinary skill in the art to which the present disclosure belongs. The terms "first," "second," etc., which are used in the description and the claims of the present application for disclosure, are not intended to indicate any sequence, amount or importance, but distinguish various components. Also, the terms such as "a," "an," etc., are not intended to limit the amount, but indicate the existence of at least one. The terms "comprise," "comprising," "include," "including," etc., are intended to specify that the elements or the objects stated before these terms encompass the elements or the objects and equivalents thereof listed after these terms, but do not preclude the other elements or objects. The phrases "connect", "connected", "coupled", etc., are not intended to define a physical connection or mechanical connection, but may include an electrical connection, directly or indirectly. "On," "under," "right," "left" and the like are only used to indicate relative position relationship, and when the position of the object which is described is changed, the relative position relationship may be changed accordingly.

Although a cathode material used for an OLED is conductive, it still has a certain electric resistance value. Therefore, when the size of an OLED panel reaches 10 inches or more, just the electric resistance of the cathode material of the OLED may cause a significant voltage drop. As a result, the display brightness of the display panel decreases, and the display uniformity of the display panel reduces accordingly. To cope with this problem, the electric resistance value of the cathode material needs to be reduced. For example, an auxiliary cathode may be provided to reduce the electric resistance value of the cathode as a whole. There are two main methods for forming the auxiliary cathode: an evaporation method and a cell-forming method. However, whether the evaporation method or the cell-forming method is used, the manufactured auxiliary cathode is located on a pixel defining layer. Due to the limitation of the area where the pixel defining layer is located, the area of the auxiliary cathode is greatly limited, so that the electrical conductivity of the cathode fails to completely meet the requirements by final products. When the auxiliary cathode is manufactured by using an evaporation method, a high-precision evaporation mask is needed. However, the metal material cannot be removed by using a cleaning process after it is deposited on the mask, so the mask is scrapped after being used several times, resulting in a higher production cost. When the auxiliary cathode is manufactured by using a cell-forming method, the formed cathode is not compatible with a thin film encapsulation (TFE) formed later, and the water and oxygen barrier property may be achieved only by the sealant located along the edge of a display panel, so that the water and oxygen barrier property of the panel is greatly degraded.

FIG. 1A is a structural schematic view of a top-emitting OLED panel. As illustrated in FIG. 1A, a thin film transistor 11, an insulating layer 12 and an OLED device are sequentially disposed on a base substrate 10. The OLED device comprises an organic light emitting layer 15 defined by a pixel defining layer 14, an anode 13 and, a cathode 16. The anode 13 is located between the organic light emitting layer 15 and the insulating layer 12 and is connected to the corresponding thin film transistor 11. The cathode 16 covers the pixel defining layer 14 and is in contact with the top side of the organic light emitting layer 15. The thin film transistor 11 is connected to the anode 13 to control the voltage applied to the anode 13. The organic light emitting layer 15 emits light by the drive of an electric field generated between the anode 13 and the cathode 16.

In order to improve luminance of the organic light emitting layer 15, the electric resistance of the cathode 16 needs to be reduced so as to improve the electrical conductivity of the cathode 16. In FIG. 1A, an auxiliary cathode 17 is formed on the cathode 16 by using an evaporation method and is connected to the cathode 16. The material of the auxiliary cathode 17 may use a metal such as magnesium (Mg), silver (Ag), aluminum (Al), gold (Au) or the like. Due to the poor light transmittance of the metal materials, the auxiliary cathode 17 is usually formed on the pixel defining layer 14, so as to prevent the auxiliary cathode 17 from affecting the light emission of the organic light emitting layer 15 and reducing the aperture ratio of the display panel, which is illustrated in FIG. 1A.

Figure 1B:
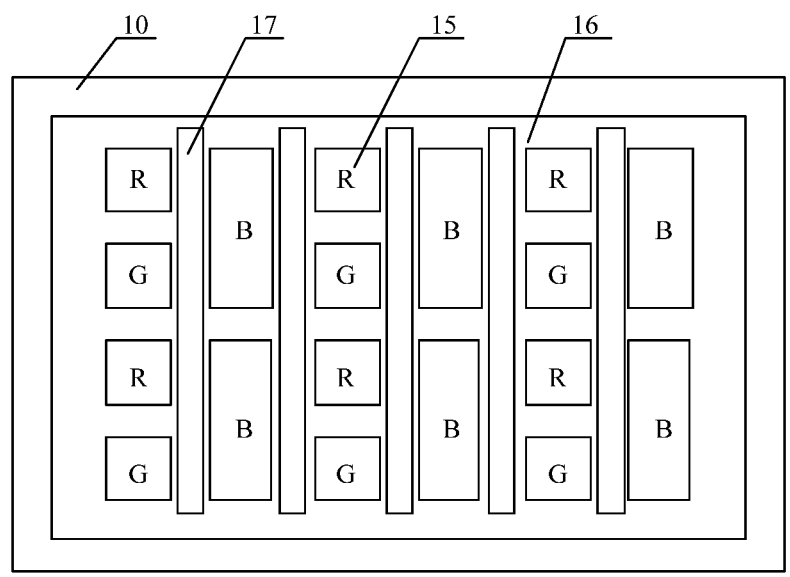
FIG. 1B is a schematic top view of the OLED panel as illustrated in FIG. 1A.

Due to the limitation of an area where the pixel defining layer 14 is located, the area of the auxiliary cathode 17 is greatly limited accordingly, as illustrated in FIG. 1B. FIG. 1B is a schematic top view of the OLED panel as illustrated in FIG. 1A. It can be seen from FIG. 1B that, because the area of the pixel defining layer 14 is small, the area of the auxiliary cathode 17 may also be formed small, i.e., the area of the auxiliary cathode 17 is limited. In FIG. 1B, the auxiliary cathode 17 is of a narrow strip. Although such an auxiliary cathode 17 improves the electrical conductivity of the cathode 16 to a certain extent, it does not allow the electrical conductivity of the cathode to completely meet the requirements. In addition, when the auxiliary cathode 17 is manufactured by using the evaporation method, a high-precision evaporation mask is needed. After the metal material is deposited on the mask, it cannot be removed by using a cleaning process, so the mask is scrapped after being used several times, resulting in a higher production cost of the OLED panel.

Figure 2:
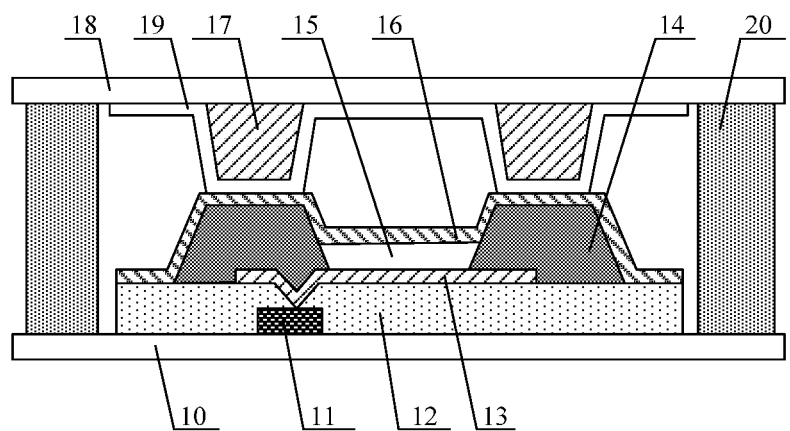
FIG. 2 is a structural schematic view of another top-emitting OLED panel.

FIG. 2 is a structural schematic view of another top-emitting OLED panel. Different from FIG. 1, in FIG. 2, the auxiliary cathode 17 is disposed on an encapsulation substrate 18, and a transparent electrode 19 is deposited on the auxiliary cathode 17. The transparent electrode 19 may use a transparent conductive material such as ITO, IZO or the like. In a packaging process, the transparent electrode 19 on the encapsulation substrate 18 and the cathode 16 are bonded or assembled together by using the cell-forming method, so that the auxiliary cathode 17 is connected to the cathode 16 to reduce the electric resistance of the cathode 16.

It can be seen from FIG. 2 that the substrate 10 is connected to the encapsulation substrate 18 through a sealant 20. The sealant 20 surrounds the thin film transistor 11, the OLED device, the auxiliary cathode 17 and the transparent electrode 19 to achieve the water and oxygen barrier property for the OLED panel. However, the OLED panel in FIG. 2 cannot use a thin film encapsulation, so the water and oxygen barrier property of the OLED panel is greatly degraded.

With respect to the above problem that the electrical conductivity of the cathode of the OLED display panel cannot completely meet the requirements, the embodiments of the present disclosure provide an OLED panel and a manufacturing method thereof.

At least one embodiment of the present disclosure provides an OLED panel. The OLED panel comprises a plurality of OLED devices disposed on a substrate. For example, theses OLED devices correspond to a plurality of sub-pixel units, for example, which are arranged in an array on the substrate. The OLED panel also comprises an auxiliary cathode. The auxiliary cathode is disposed on a cathode of the OLED devices in electrical contact with the cathode, and is located in light emitting areas of the OLED devices. A material of the auxiliary cathode is a transparent conductive material, for example, a transparent conductive oxide material.

At least one embodiment of the present disclosure also provides a manufacturing method of an OLED panel, which comprises: forming a plurality of OLED devices on a substrate; and forming an auxiliary cathode on a cathode of the OLED devices, which is disposed on the cathode of the OLED devices in electrical contact with the cathode and is at least partially located in light emitting areas of the OLED devices, and a material of which is a transparent conductive material, for example, a transparent conductive oxide material.

In the embodiments of the present disclosure, by disposing the auxiliary cathode in the light emitting areas, because the area of the light emitting areas is large, the area of the auxiliary cathode is enlarged as well, and the electric resistance of the cathode (a power supply terminal) is greatly reduced, thereby reducing the voltage drop caused by the cathode itself, allowing the electrical conductivity of the cathode to meet the requirements of a large-sized display panel, and improving the brightness uniformity of the display panel.

The technical proposal of the embodiments of the present disclosure is described below in detail with reference to the specific examples.

Figure 3:
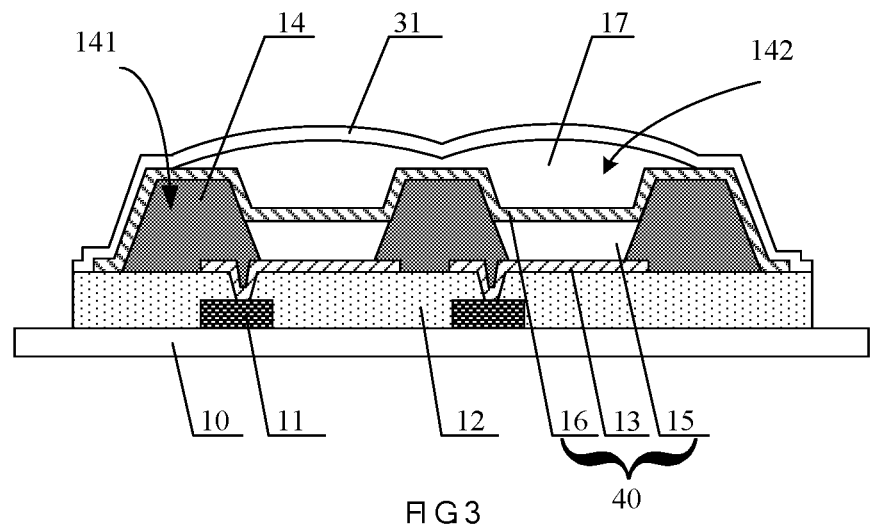
FIG. 3 is a schematic cross-sectional view of a top-emitting OLED panel provided by a first embodiment of the present disclosure.

FIG. 3 is a schematic cross-sectional view of a top-emitting OLED panel provided by a first embodiment of the present disclosure. It can be seen from FIG. 3 that the OLED panel comprises a plurality of OLED devices 40 disposed on the substrate 10, and the OLED devices 40 each comprise an organic light emitting layer 15 defined by a pixel defining layer 14, an anode 13 located on the bottom side of the organic light emitting layer 15, and a cathode 16 located on the top side of the organic light emitting layer 15. The OLED panel further comprises an auxiliary cathode 17. The auxiliary cathode 17 is disposed on the cathode 16 of the OLED devices in electrical contact with the cathode 16 and is at least partially located in light emitting areas of the OLED devices 40. The light emitting areas of the OLED devices 40 correspond to the areas where the cathode 16 and the anodes 13 of the OLED devices 40 face each other respectively. In each of the light emitting areas the organic light emitting layer 15 can emit light under the effect of the electric field between the cathode 16 and the anode 13, and the organic light emitting layer 15 located outside these areas do not participate in light emission substantially. The material of the auxiliary cathode 17 is a transparent conductive material, for example, a transparent conductive oxide.

As illustrated in FIG. 3, the OLED panel further comprises a pixel driving circuit including a plurality of thin film transistors 11 and the insulating layer 12 covering the thin film transistors 11 which are disposed on the substrate 10 in sequence. The OLED devices 40 are disposed on the insulating layer 12. The OLED devices 40 correspond to the thin film transistors 11 respectively. For example, each thin film transistor 11 as illustrated in the figure is a driving transistor in the pixel driving circuit which is configured to control a driving electric current for driving one OLED device 40 to emit light under control of an input data signal.

The anode 13 is located between the organic light emitting layer 15 and the insulating layer 12, and for example, is electrically connected to a source electrode or a drain electrode of the corresponding thin film transistor 11 through a via hole formed in the insulating layer 12, so as to receive the driving electric current. The cathode 16 covers the pixel defining layer 14 and is in contact with the top side of the organic light emitting layer 15. The organic light emitting layer 15 emits light by the driving of the electric field between the anode 13 and the cathode 16.

Figure 4:
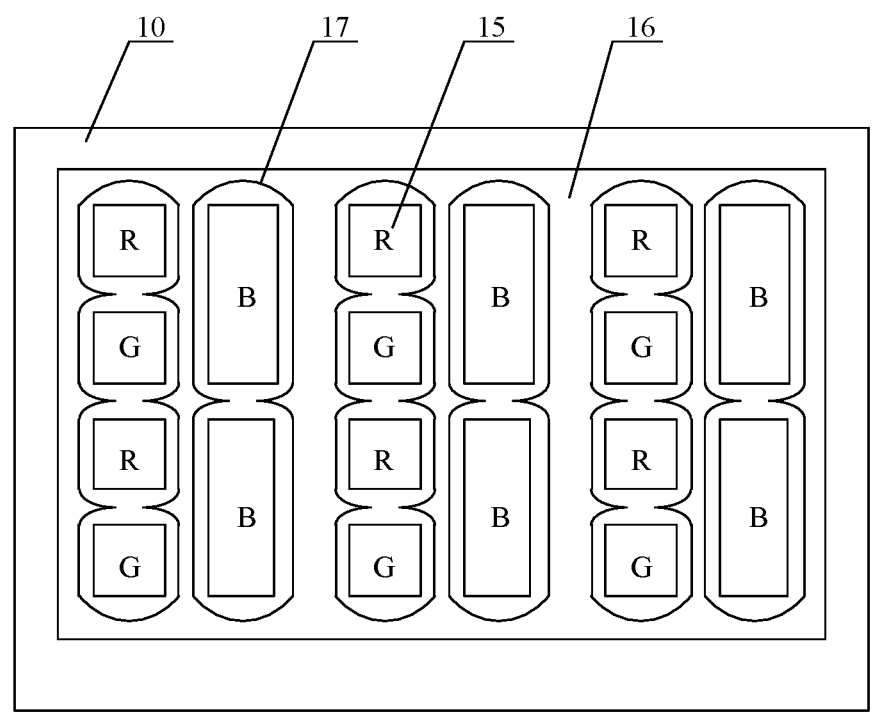
FIG. 4 is a schematic top view of the top-emitting OLED panel provided by the first embodiment of the present disclosure.

As illustrated in FIG. 3 and FIG. 4, the OLED devices 40 correspond to a plurality of sub-pixel units, for example, which are arranged in an array on the substrate. For example, these sub-pixel units comprise a red sub-pixel unit R, a green sub-pixel unit G, and a blue sub-pixel unit B. Accordingly, the OLED devices of the red sub-pixel unit R, the green sub-pixel unit G, and the blue sub-pixel unit B respectively use different organic light emitting materials to emit red light, green light, and blue light. The pixel defining layer 14 is formed on the substrate and comprises a plurality of openings 142 defined by convex portions 141, each opening 142 corresponding to one or more sub-pixel units.

For example, the cathode 16 is a common cathode, i.e., the cathodes (portions of the cathode 16) of at least two adjacent OLED devices are integrated, and the cathode 16 simultaneously covers at least two adjacent sub-pixel units and the convex portion 141 of the pixel defining layer 14 between the sub-pixel units. Relative to the substrate 10, the portion of the surface of the cathode 16 in the light emitting area of the OLED device is lower than the portion on the convex portion 141 of the pixel defining layer 14, thus the cathode 16 has a concave portion in the light emitting area, and the auxiliary cathode 17 is at least partially formed in the concave portion of the cathode 16, which helps to form the auxiliary cathode 17 by using an ink jet printing method and control the profile of the auxiliary cathode 17. For example, the auxiliary cathode 17 covers the light emitting areas of the sub-pixel units in a curved profile.

The pixel driving circuit used for the pixel unit may adopt any suitable pixel driving circuit, such as a 2T1C pixel driving circuit, i.e., two thin film transistors (TFTs) and one storage capacitor Cs are used to realize the basic function of driving an OLED to emit light. One of the two TFTs is a driving transistor and the other is a switching transistor. The switching transistor is electrically connected to a gate line and a data line to input a data signal of the data line under control of a scan signal of the gate line to control the driving transistor. A variety of pixel driving circuits having compensation functions based on the basic 2T1C pixel driving circuit are also provided in the industry. The compensation function may be achieved through the way of voltage compensation, electric current compensation, or composite compensation. The pixel driving circuit having a compensation function may be, for example, 4T1C, 4T2C, or the like.

In order to facilitate the light emission of the organic light emitting layer of the OLED devices, a material of the cathode 16 may be a transparent conductive oxide, such as IZO, ITO, or the like. Because the transparent conductive oxide itself has a certain water barrier property, when the cathode 16 is made of the transparent conductive oxide, it is more beneficial to manufacture the auxiliary cathode 17 by using an ink jet printing method and controlling the profile of the auxiliary cathode 17.

The auxiliary cathode 17 is disposed on the cathode 16 and at least partially located in the light emitting areas of the OLED devices 40. That is, the orthographic projection of the auxiliary cathode 17 on the substrate 10 may be entirely within the light emitting areas, or may be partially within the light emitting areas. Because the surface area of the light emitting areas of the OLED devices is larger than the surface area of the top surface of the pixel defining layer between the OLED devices, when then auxiliary cathode 17 is formed on the cathode 16, the surface area of the auxiliary cathode 17 is greatly increased, enabling the combined electrical conductivity of the auxiliary cathode 17 and the cathode 16 to be greatly improved to meet the requirements of a large-sized display panel, and to improve the brightness uniformity of the display panel. It can be seen from FIG. 3 that the auxiliary cathode 17 is disposed on the cathode 16 and stretches across the area where the organic light emitting layer 15 is located, i.e., at least partially covers the light emitting areas of the OLED devices, for example, completely covers the light emitting areas of the OLED devices.

In at least one example, in order to more effectively reduce the electric resistance of the cathode to improve the electrical conductivity of the cathode, preferably, portions of the auxiliary cathode 17 on two adjacent OLED devices 40 are connected to each other, so that the area of the auxiliary cathode 17 is larger, further improving the electrical conductivity of the cathode 16. It can be seen from FIG. 3 that portions of the auxiliary cathodes 17 on at least two adjacent OLED devices 40 are connected to each other as one integral body on the pixel defining layer 14 between the two adjacent OLED devices 40.

FIG. 4 is a schematic top view of the top-emitting OLED panel provided by the first embodiment of the present disclosure. In FIG. 4, the organic light emitting layers (of the pixel units) of the OLED panel is arranged in a form of "Δ", and the portions of the auxiliary cathode corresponding to two adjacent organic light emitting layers in each column are connected to each other, i.e., the auxiliary cathode is longitudinally connected as illustrated. It is easily understood by those skilled in the art that when the organic light emitting layers are arranged in a matrix or other arrangement, the auxiliary cathode may be longitudinally connected or transversely connected according to needs. Of course, the auxiliary cathode may also be connected both longitudinally and transversely. The portions of the auxiliary cathode which are connected to each other can increase the thickness and area of the cathode overall, reduce the electric resistance of the cathode, and improve the electrical conductivity of the cathode.

In order to prevent the auxiliary cathode 17 from affecting the luminous efficacy of the organic light emitting layer 15, for example, the material of the auxiliary cathode 17 is a transparent conductive oxide such as one or more of indium zinc oxide (IZO), indium tin oxide (ITO), zinc oxide (ZnO), indium oxide ($In_2O_3$) or the like. The auxiliary cathode 17 made of the transparent conductive oxide can not only reduce the electric resistance of the cathode 16 and improve the electrical conductivity of the cathode 16, but also has preferable photopermeability.

In this embodiment, a light emergent surface of the auxiliary cathode 17 protrudes outward along the light emergent direction (that is, the upward direction in the figure) of the OLED device. For example, the light emergent surface of the auxiliary cathode 17 is a spherical surface which protrudes outward along the light emergent direction, for example, an ellipsoidal surface. When the light emergent surface of the auxiliary cathode 17 protrudes outward along the light emergent direction, the auxiliary cathode 17 has a function of a convex lens, so that the light emitted by the organic light emitting layer 15 can be collected, the luminous efficacy of the light emitting layer of the OLED can be improved, and the brightness of the panel can be increased accordingly. For example, in order to reduce the cost of the display panel, the material for manufacturing the auxiliary cathode may be made into a solution by using a solution process first, and the auxiliary cathode 17 may be manufactured by using an ink jet printing method. By manufacturing the auxiliary cathode 17 using the ink jet printing method and no longer using the evaporation method, it is no longer necessary to use an evaporation mask, which reduces the manufacturing cost of the display panel.

In the embodiment of the present disclosure, the OLED panel further comprises a thin film encapsulation structure. In the embodiment illustrated in FIG. 3, the thin film encapsulation structure is disposed on the auxiliary cathode 17 and covers the insulating layer 12. The thin film encapsulation structure in this embodiment comprises a first inorganic encapsulation layer 31. The first inorganic encapsulation layer 31 is disposed on the auxiliary cathode 17 and covers the insulating layer 12, thereby forming a closed and airtight space between the first inorganic encapsulation layer 31 and the insulating layer 12. The anode 13, the organic light emitting layer 15, the cathode 16, the auxiliary cathode 17, and the pixel defining layer 14 are all located in the closed and airtight space, thereby improving the water and oxygen barrier property of the OLED panel.

Figure 5:
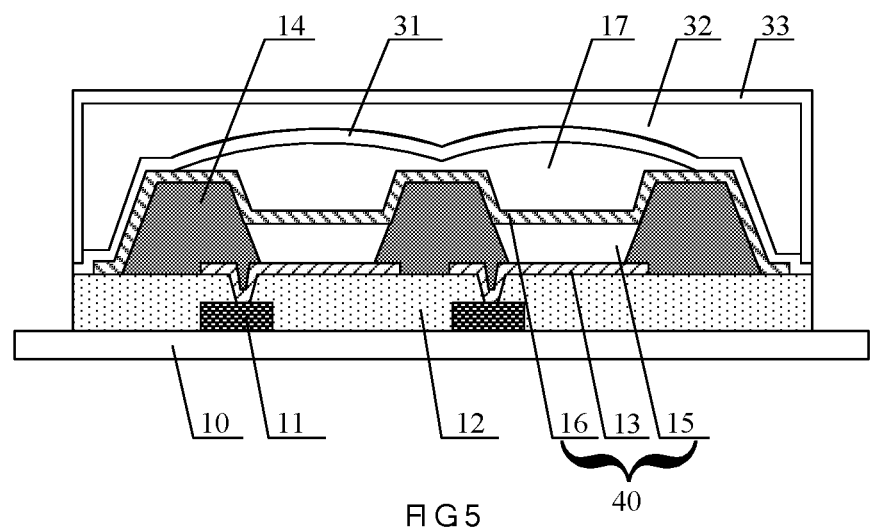
FIG. 5 is a schematic cross-sectional view of a top-emitting OLED panel provided by a second embodiment of the present disclosure.

FIG. 5 is a schematic cross-sectional view of a top-emitting OLED panel provided by a second embodiment of the present disclosure. Different from the first embodiment, in this embodiment, as illustrated in FIG. 5, the thin film encapsulation structure further comprises an organic encapsulation layer 32 and a second inorganic encapsulation layer 33 sequentially disposed on the first inorganic encapsulation layer 31. A projection of the organic encapsulation layer 32 on the substrate 10 encloses a projection of the cathode 16 on the substrate 10, and the projection of the organic encapsulation layer 32 on the substrate 10 is located inside a projection of the first inorganic encapsulation layer 31 on the substrate. A projection of the second inorganic encapsulation layer 33 on the substrate 10 encloses the projection of the organic encapsulation layer 32 on the substrate 10.

Here, the organic encapsulation layer 32 can provide a flat surface for the panel, so that the flat second inorganic encapsulation layer 33 can be manufactured on the surface of the organic encapsulation layer 32. In order to prevent the organic encapsulation layer 32 from being permeated by aqueous vapour and oxygen, the projection of the organic encapsulation layer 32 on the substrate 10 is located inside the projection of the first inorganic encapsulation layer 31 on the substrate 10, and the projection of the organic encapsulation layer 32 on the substrate 10 is also located inside the projection of the second inorganic encapsulation layer 33 on the substrate 10. With such a structure, the first inorganic encapsulation layer 31 and the second inorganic encapsulation layer 33 can cover the organic encapsulation layer 32 and prevent the organic encapsulation layer 32 from being permeated by aqueous vapour and oxygen.

Such a thin film encapsulation structure further improves the hermeticity of the enclosed space between the thin film encapsulation structure and the insulating layer 12, further improves the water and oxygen barrier property of the OLED panel, and improves the lifetime of the OLED panel.

Figure 6:
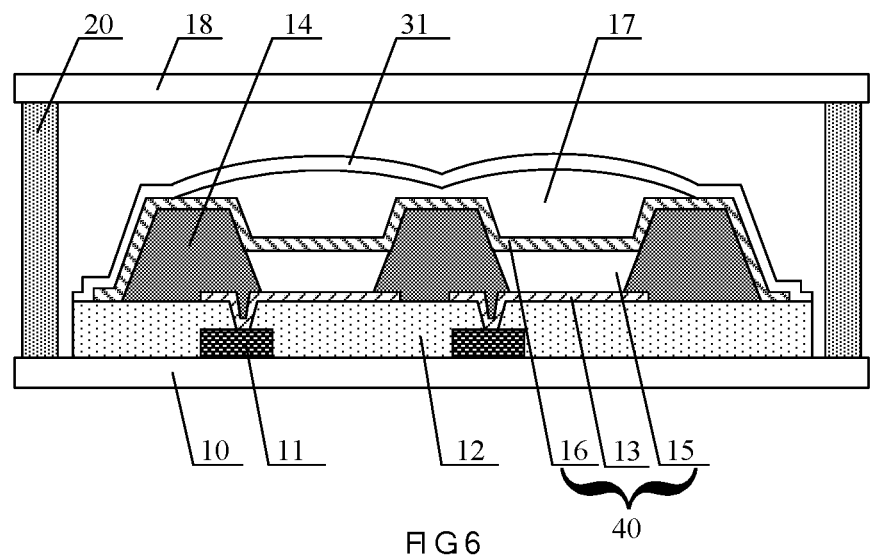
FIG. 6 is a schematic cross-sectional view of a top-emitting OLED panel provided by a third embodiment of the present disclosure.

FIG. 6 is a schematic cross-sectional view of a top-emitting OLED panel provided by a third embodiment of the present disclosure. Different from the first embodiment, in this embodiment, as illustrated in FIG. 6, the OLED panel further comprises the encapsulation substrate 18 and the sealant 20. The encapsulation substrate 18 is disposed on the side of the OLED panel far away from the substrate 10. In FIG. 6, the substrate 10 is on the bottom side of the panel and the encapsulation substrate 18 is on the top side of the panel. The sealant 20 is disposed at the periphery of the insulating layer 12. The substrate 10 is connected to the encapsulation substrate 18 through the sealant 20. In this way, a closed and airtight space between the substrate 10, the encapsulation substrate 18 and the sealant 20 is formed, and the OLED devices and the like are enclosed therein, thereby further improving the water and oxygen barrier property of the OLED panel.

Figure 7:
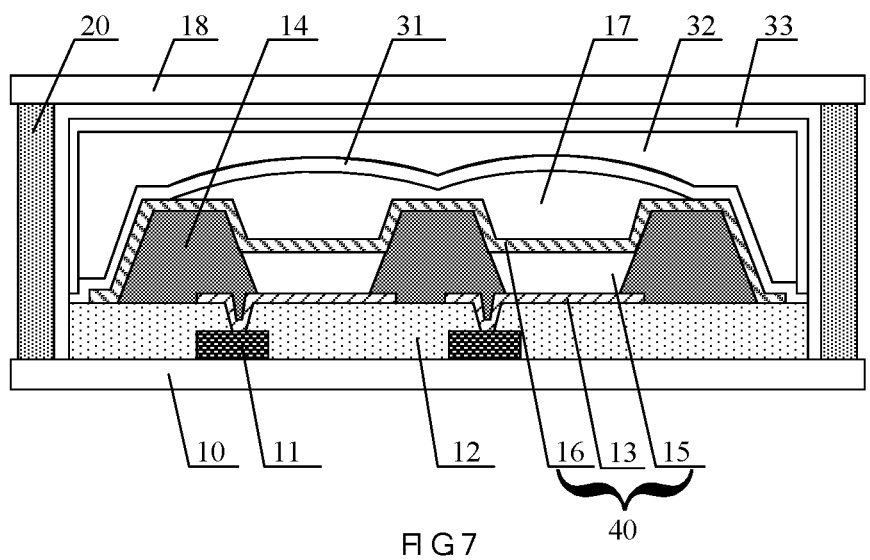
FIG. 7 is a schematic cross-sectional view of a top-emitting OLED panel provided by a fourth embodiment of the present disclosure.

FIG. 7 is a schematic cross-sectional view of a top-emitting OLED panel provided by a fourth embodiment of the present disclosure. Different from the second embodiment, in this embodiment, as illustrated in FIG. 7, the OLED panel further comprises the encapsulation substrate 18 and the sealant 20. The encapsulation substrate 18 is disposed on the side of the OLED panel far away from the substrate 10. The sealant 20 is disposed at the periphery of the insulating layer 12. The substrate 10 is connected to the encapsulation substrate 18 through the sealant 20. In this way, a closed and airtight space between the substrate 10, the encapsulation substrate 18 and the sealant 20 is formed, and the OLED devices and the like are enclosed therein, thereby further improving the water and oxygen barrier property of the OLED panel.

It should be noted that the substrate and the encapsulation substrate in the above embodiments may use a rigid material such as glass or the like, and may also use a flexible material such as polyimide (PI), polyethylene terephthalate (PET) or the like for applying to flexible panels.

Figure 8:
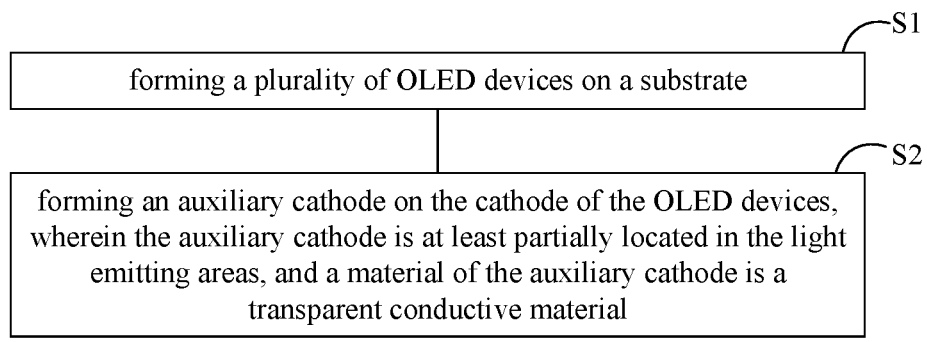
FIG. 8 is a schematic flow chart of a manufacturing method of an OLED panel provided by a fifth embodiment of the present disclosure.

At least one embodiment of the present disclosure provides a manufacturing method of an OLED panel. FIG. 8 is a schematic flow chart of a manufacturing method of an OLED panel provided by a fifth embodiment of the present disclosure. The manufacturing method comprises the following operations:

Step S1: forming a plurality of OLED devices on a substrate; and

Step S2: forming an auxiliary cathode on a cathode of the OLED devices, which is at least partially located in the light emitting areas and a material of which is a transparent conductive material.

In one example, a light emergent surface of the auxiliary cathode protrudes outward along a light emergent direction, for example, which has a spherical surface.

In one embodiment, one example of step S2 may comprise: preparing a solution containing the transparent conductive material by using a solution process; printing the solution on the cathode located in the light emitting areas by using an ink jet printing method; and solidifying the printed solution to form the auxiliary cathode which is at least partially located in the light emitting areas.

Because the organic light emitting layer cannot withstand a high temperature, for example, when the solution printed on the cathode of the OLED devices is solidified, the curing temperature is about 70 □ to 90 □, preferably about 70 □ to 80 □, so as to prevent the organic light emitting layer from being damaged or degraded.

In order to prevent other materials on the panel being adversely affected by water and oxygen, for example, an aqueous oxygen content of the prepared solution containing the transparent conductive material is about 0.8 ppm to 1.2 ppm, preferably about 0.8 ppm to 1 ppm.

For example, when the ink jet printing method is performed, the sprayed solution of the transparent conductive oxide is at least partially located in the concave portion of the surface of the cathode. The concave portion helps to maintain the solution of the transparent conductive oxide and the profile of the auxiliary cathode formed after being solidified.

The technical proposal of the embodiments of the present disclosure is described in detail with reference to the exemplary manufacturing process of the OLED panel.

Figure 9:
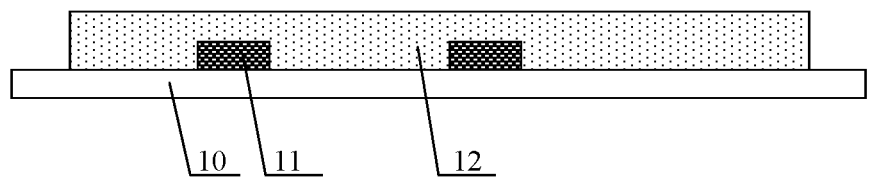
FIG. 9 is a structural schematic view of the OLED panel after forming an insulating layer in the fifth embodiment of the present disclosure.

First, a plurality of thin film transistors 11 for the pixel driving circuit are formed on the substrate, and then the insulating layer 12 covering the thin film transistors is formed. This process may use the known semiconductor preparation technique and will not be repeated here. In one example, the via hole used for exposing the drain electrode of the thin film transistor 11 is disposed in the formed insulating layer 12, as illustrated in FIG. 9.

Figure 10:
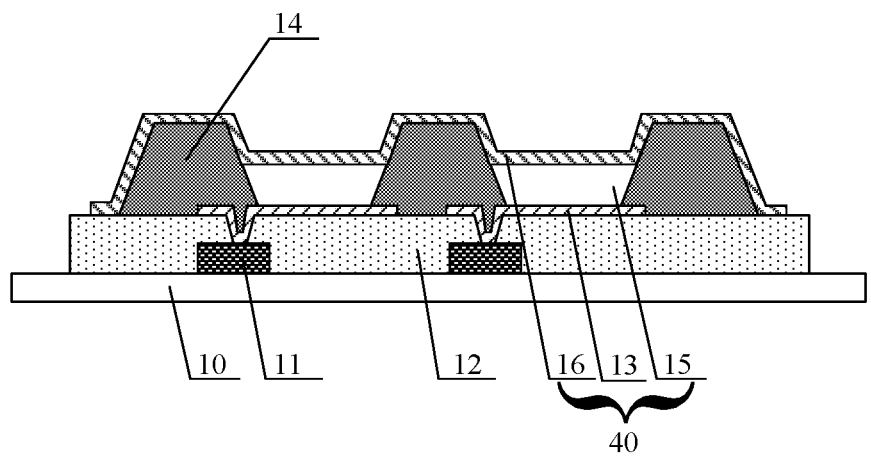
FIG. 10 is a structural schematic view of the OLED panel after forming OLED devices in the fifth embodiment of the present disclosure.

Then, the OLED devices corresponding to the thin film transistors are formed on the insulating layer 12. One example of forming the OLED device comprises: forming the anode 13 of the OLED device on the insulating layer 12, and the anode 13 is connected to the drain electrode of the corresponding thin film transistor 11 through the via hole in the insulating layer 12; on the insulating layer 12 formed with the anode 13, forming the pixel defining layer 14 for defining the area where the organic light emitting layer is located; forming the organic light emitting layer 15 within the opening defined by the pixel defining layer 14; and forming the cathode 16 of the OLED device, which covers the pixel defining layer 14 and is in contact with the top side of the organic light emitting layer 15, as illustrated in FIG. 10. The material of the anode 13 may be the transparent conductive oxide such as IZO, ITO, or the like. The material of the pixel defining layer 14 may be an inorganic insulating material (for example, a silicon oxide) or an organic insulating material (for example, an organic resin). The material of the cathode 16 may be the transparent conductive oxide such as IZO, ITO, or the like. For example, the thickness of the cathode 16 is about 500 angstroms to 1500 angstroms. In another example, the cathode 16 may also be a composite structure made of the transparent conductive oxide and a metal material.

Further then, the auxiliary cathode is formed on the cathode of the OLED devices by using the ink jet printing method. The auxiliary cathode is at least partially located in the areas where the organic light emitting layers are located (i.e., light emitting areas). The light emergent surface of the auxiliary cathode protrudes outward along the light emergent direction. The material of the auxiliary cathode is the transparent conductive oxide.

Figure 11:
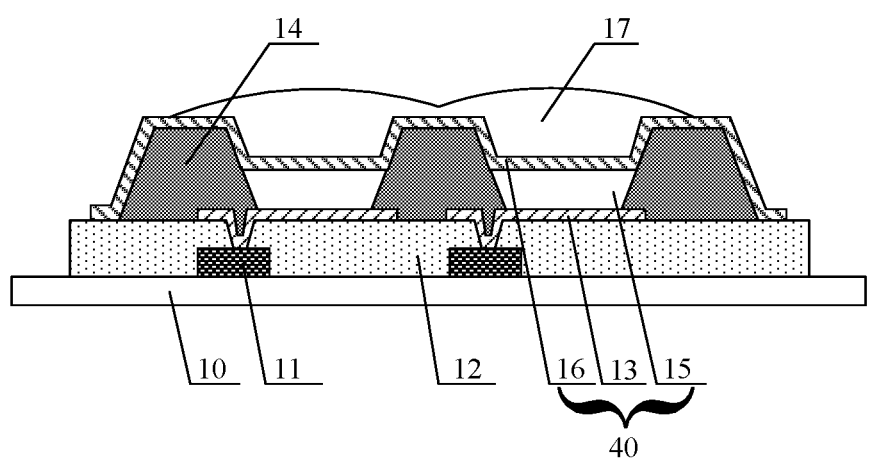
FIG. 11 is a structural schematic view of the OLED panel after forming an auxiliary cathode in the fifth embodiment of the present disclosure.

One example of forming the auxiliary cathode comprises: preparing the solution containing the transparent conductive material by using the solution process, the aqueous oxygen content of the solution being about 0.8 ppm to 1.2 ppm so as to prevent other layers from being water oxidized by the solution; printing the solution on the cathode 16 located in the light emitting areas by using the ink jet printing method; and solidifying the solution printed on the cathode 16 of the OLED devices, for example, the curing temperature being about 70 □ to 80 □, so as to form the auxiliary cathode 17, which is at least partially located in the light emitting areas and the light emergent surface of which protrudes outward along the light emergent direction, as illustrated in FIG. 11.

The material of the auxiliary cathode 17 is the transparent conductive oxide, such as one or more of IZO, ITO, ZnO, $In_2O_3$ or the like. In the concave portion formed by the cathode 16, due to the surface tension of the solution, the light emergent surface of the formed auxiliary cathode 17 protrudes outward along the light emergent direction. Such an auxiliary cathode 17 can improve the luminous efficacy of the organic light emitting layer 15, thereby promoting the display brightness of the display panel.

For example, the portions of the auxiliary cathode 17 located in two adjacent light emitting areas are connected to each other, which is beneficial to reduce the electric resistance of the cathode and to improve the electrical conductivity of the cathode.

In one example, when the auxiliary cathode is formed, the thickness of the auxiliary cathode may be controlled by controlling the number of droplets of the solution. For example, the central thickness of the auxiliary cathode 17 is about 1000 angstroms to 2000 angstroms.

Figure 12:
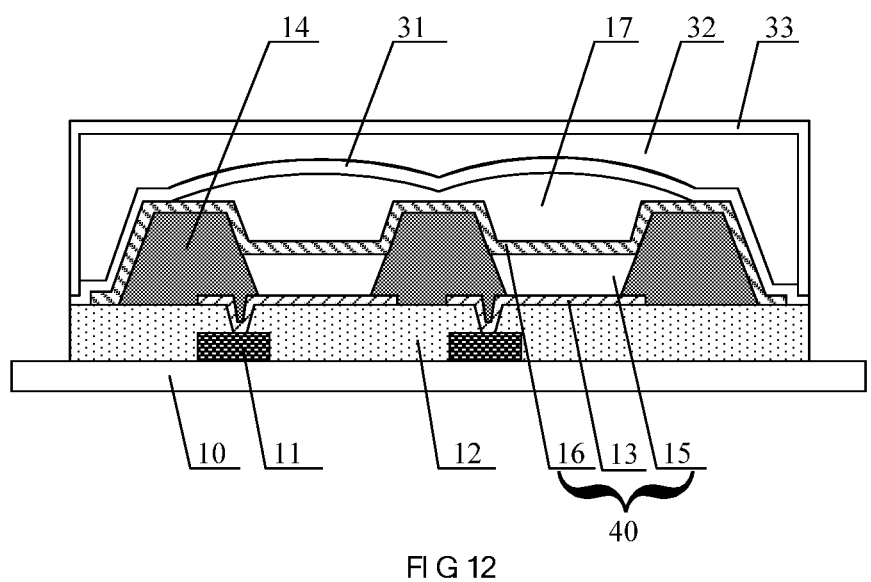
FIG. 12 is a structural schematic view of the OLED panel after forming a thin film encapsulation structure in the fifth embodiment of the present disclosure.

After that, the thin film encapsulation structure is formed on the auxiliary cathode. One example of forming the thin film encapsulation structure comprises: forming the first inorganic encapsulation layer 31 on the auxiliary cathode 17 which covers the insulating layer 12; forming the organic encapsulation layer 32 on the first inorganic encapsulation layer 31, the projection of the organic encapsulation layer 32 on the substrate 10 enclosing the projection of the cathode 16 on the substrate 10, and the projection of the organic encapsulation layer 32 on the substrate 10 being located inside the projection of the first inorganic encapsulation layer 31 on the substrate 10; and forming the second inorganic encapsulation layer 33 on the organic encapsulation layer 32, and the projection of the second inorganic encapsulation layer 33 on the substrate 10 enclosing the projection of the organic encapsulation layer 32 on the substrate 10, as illustrated in FIG. 12.

At last, on the substrate 10, the sealant 20 is coated at the periphery of the insulating layer 12; and the encapsulation substrate 18 is disposed on the top of the sealant 20, and the sealant 20 is solidified. The substrate 10 is connected to the encapsulation substrate 18 through the sealant 20. The closed and airtight space is formed between the substrate 10, the encapsulation substrate 18 and the sealant 20, and the OLED devices and the like are enclosed therein, as illustrated in FIG. 7.

What are described above is related to the illustrative embodiments of the disclosure only and not limitative to the scope of the disclosure; the scopes of the disclosure are defined by the accompanying claims.

What is claimed is:

1. An organic light emitting diode (OLED) panel, comprising:
   a substrate;
   a plurality of OLED devices disposed on the substrate, wherein the OLED devices comprise a cathode and have light emitting areas respectively; and
   an auxiliary cathode,
   wherein the auxiliary cathode is disposed on the cathode of the OLED devices in electrical contact with the cathode and the auxiliary cathode is at least partially located in the light emitting areas of the OLED devices,
   a material of the auxiliary cathode is a transparent conductive material, and
   a light emergent surface of the auxiliary cathode protrudes outward along a light emergent direction of the OLED device, a protruding portion of the auxiliary cathode completely covers the light emitting areas of the OLED devices, and the light emergent surface is a surface of the protruding portion away from the substrate.

2. The OLED panel according to claim 1, wherein the transparent conductive material of the auxiliary cathode comprises a transparent conductive oxide.

3. The OLED panel according to claim 2, wherein the transparent conductive oxide comprises one or more of indium zinc oxide, indium tin oxide, zinc oxide and indium oxide.

4. The OLED panel according to claim 1, wherein portions of the auxiliary cathode on two adjacent OLED devices are connected to each other.

5. The OLED panel according to claim 1, further comprising: a pixel driving circuit disposed on the substrate and an insulating layer covering the pixel driving circuit,
   wherein the OLED devices are disposed on the insulating layer.

6. The OLED panel according to claim 5, further comprising a thin film encapsulation structure, wherein the thin film encapsulation structure is disposed on the auxiliary cathode and covers the insulating layer.

7. The OLED panel according to claim 6, wherein the thin film encapsulation structure comprises a first inorganic encapsulation layer, and
the first inorganic encapsulation layer is disposed on the auxiliary cathode and covers the insulating layer.

8. The OLED panel according to claim 6, wherein the thin film encapsulation structure comprises a first inorganic encapsulation layer, an organic encapsulation layer and a second inorganic encapsulation layer,
the first inorganic encapsulation layer is disposed on the auxiliary cathode and covers the insulating layer,
the organic encapsulation layer is disposed on the first inorganic encapsulation layer, and
the second inorganic encapsulation layer is disposed on the organic encapsulation layer.

9. The OLED panel according to claim 8, wherein a projection of the organic encapsulation layer on the substrate encloses a projection of the cathode of the OLED devices on the substrate, and
the projection of the organic encapsulation layer on the substrate is located inside a projection of the first inorganic encapsulation layer on the substrate.

10. The OLED panel according to claim 9, wherein a projection of the second inorganic encapsulation layer on the substrate encloses the projection of the organic encapsulation layer on the substrate.

11. The OLED panel according to claim 5, further comprising an encapsulation substrate and a sealant,
wherein the encapsulation substrate is disposed on the side of the OLED panel far away from the substrate,
the sealant is disposed at periphery of the insulating layer, and
the substrate is connected to the encapsulation substrate through the sealant.

12. A manufacturing method of the organic light emitting diode (OLED) panel according to claim 1, comprising:
forming the plurality of OLED devices on the substrate; and
forming the auxiliary cathode on the cathode of the OLED devices.

13. The manufacturing method according to claim 12, wherein forming of the auxiliary cathode on the cathode of the OLED devices comprises:
preparing a solution containing the transparent conductive material;
printing the solution on the cathode by using an ink jet printing method; and
solidifying the printed solution to form the auxiliary cathode.

14. The manufacturing method according to claim 13, wherein an aqueous oxygen content of the solution is about 0.8 ppm to 1.2 ppm.

15. The OLED panel according to claim 1, wherein the light emergent surface of the auxiliary cathode is a spherical surface or an ellipsoidal surface.

* * * * *